US009997336B2

(12) United States Patent
Meng et al.

(10) Patent No.: US 9,997,336 B2
(45) Date of Patent: Jun. 12, 2018

(54) MULTI-ZONE GAS DISTRIBUTION PLATE (GDP) AND A METHOD FOR DESIGNING THE MULTI-ZONE GDP

(71) Applicant: Taiwan Semiconductor Manufacturing Co., Ltd., Hsin-Chu (TW)

(72) Inventors: Chin-Han Meng, Hsinchu (TW); Jr-Sheng Chen, Hsinchu (TW); Yin-Tun Chou, Hsinchu (TW); Chih-Hua Chan, Hsinchu (TW); Lin-Ching Huang, Hsinchu (TW); Yu-Pei Chiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 9 days.

(21) Appl. No.: 15/138,499

(22) Filed: Apr. 26, 2016

(65) Prior Publication Data

US 2017/0309500 A1    Oct. 26, 2017

(51) Int. Cl.
*H01L 21/67* (2006.01)
*H01L 21/82* (2006.01)
(Continued)

(52) U.S. Cl.
CPC .... *H01J 37/3244* (2013.01); *H01J 37/32009* (2013.01); *H01J 37/32449* (2013.01);
(Continued)

(58) Field of Classification Search
None
See application file for complete search history.

(56) References Cited

U.S. PATENT DOCUMENTS

| 4,918,374 A | * | 4/1990 | Stewart | G01R 1/07342 |
| | | | | 324/500 |
| 7,170,307 B2 | * | 1/2007 | Strom | G01R 3/00 |
| | | | | 324/750.23 |

(Continued)

OTHER PUBLICATIONS

Cenk Acar; "Design Concept and Preliminary Experimental Demonstration of 4-DOF MEMS Gyroscopes;" University of California, Irving, Microsystems Laborator Technical Report; Mar. 7, 2002; p. 1-65.

(Continued)

*Primary Examiner* — Shamim Ahmed
(74) *Attorney, Agent, or Firm* — Eschweiler & Potashnik, LLC (57) ABSTRACT

A multi-zone gas distribution plate (GDP) for high uniformity in plasma-based etching is provided. A housing defines a process chamber and comprises a gas inlet configured to receive a process gas. A GDP is arranged in the process chamber and is configured to distribute the process gas within the process chamber. The GDP comprises a plurality of holes extending through the GDP, and further comprises a plurality of zones into which the holes are grouped. The zones comprise a first zone and a second zone. Holes of the first zone share a first cross-sectional profile and holes of the second zone share a second cross-sectional profile different than the first cross-sectional profile. A method for designing the multi-zone GDP is also provided.

20 Claims, 9 Drawing Sheets

(51) Int. Cl.
*H01J 37/32* (2006.01)
*H01L 21/66* (2006.01)
*H01L 21/3065* (2006.01)
*H01L 21/308* (2006.01)
*H01L 21/027* (2006.01)

(52) U.S. Cl.
CPC ...... *H01L 21/0273* (2013.01); *H01L 21/3065* (2013.01); *H01L 21/3081* (2013.01); *H01L 21/82* (2013.01); *H01L 22/12* (2013.01)

(56) References Cited

U.S. PATENT DOCUMENTS

| | | |
|---|---|---|
| 7,851,234 B2 | 12/2010 | Ko et al. |
| 2006/0262287 A1 | 11/2006 | Hiar et al. |
| 2009/0178714 A1* | 7/2009 | Sawusch ................... F17D 5/00 137/12 |
| 2010/0213960 A1* | 8/2010 | Mok ....................... G01R 35/00 324/762.03 |
| 2012/0305190 A1 | 12/2012 | Kang et al. |
| 2015/0380281 A1* | 12/2015 | Sriraman .......... H01L 21/32136 438/710 |

OTHER PUBLICATIONS

Peng Qu, et al.; "Design and Characterization of a Fully Differential MEMS Accelerometer Fabricated Using MetalMUMPs Technology;" Sensors 2013, ISSN 1424-8220; www.mdpi.com/journal/sensors; May 2, 2013; p. 1-17.

Shengkui Gao; "Dry Etching and Reactive Ion Etching (RIE);" MEMS 5611; Feb. 19, 2013; p. 1-28.

* cited by examiner

MULTI-ZONE GAS DISTRIBUTION PLATE (GDP) AND A METHOD FOR DESIGNING THE MULTI-ZONE GDP

BACKGROUND

During the manufacture of integrated circuits (ICs), multi-step sequences of semiconductor manufacturing processes are performed to gradually form electronic device on semiconductor substrates. One such semiconductor manufacturing process is plasma-based etching. Plasma-based etching is a process by which material is removed from a workpiece by application of chemically reactive plasma to the workpiece and/or by bombardment of the workpiece with plasma particles. Plasma-based etching may be used according a Bosch process to form deep, highly anisotropic holes or trenches, such that plasma-based etching is often used during the manufacture of microelectromechanical systems (MEMS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical systems (MEMS) motion sensors are often employed within portable electronic devices and internet of things (IOT) devices to sense device position. Some MEMS motion sensors sense device position using gyroscopes and accelerometers, such that performance is dependent upon the sensitivity and the accuracy of the gyroscopes and the accelerometers. However, increasing the sensitivity and the accuracy leads to process challenges with plasma-based etching used to define the gyroscopes and the accelerometers. One such challenge is achieving uniform etching across a workpiece during bulk manufacture. Failure to do so may lead to non-uniformities in critical dimensions and/or drive frequencies, which may inhibit increases in the sensitivity and the accuracy. Further, the challenge is exacerbated by high aspect ratios (i.e., ratios of depth to width) of openings and/or trenches defining the gyroscopes and the accelerometers.

One approach for achieving uniform plasma-based etching is to use a gas distribution plate (GDP). The GDP is arranged in a process chamber and comprises an array of holes through which process gas enters the process chamber. The holes share a common cross-sectional profile and are evenly spaced in a distribution pattern, such that the process gas is distributed in the process chamber according to the distribution pattern. By distributing the process gas, the GDP improves plasma uniformity and hence etching uniformity. However, due to the even spacing of the holes and/or the common cross-sectional profile, the GDP does not compensate for non-uniformities in the plasma and etching caused by a layout of the process chamber. The layout may be defined by, for example, an arrangement of gas inlets, gas outlets, radio frequency (RF) electrodes, or a combination of the foregoing.

Other approaches for achieving uniform plasma-based etching include process recipe tuning and extending exposure. Process recipe tuning includes adjusting etching parameters, such as flow rate, temperature, excitation energy, and process gate ratios, to improve plasma and etching uniformity. However, process recipe tuning is unable to overcome non-uniformities caused by the layout of the process chamber. Extending exposure includes varying exposure energy applied to different regions of a photoresist layer to vary the sizes of features developed in the photoresist layer, such that non-uniformities are compensated for when the features are transferred to an underlying layer. For example, increasing exposure energy at a region of the photoresist layer where transferred features are historically large reduces the transferred feature sizes and hence compensates for non-uniformities. However, extending exposure reduces throughput when non-uniformities are too extensive.

The present application is directed towards a multi-zone GDP for high uniformity in plasma-based etching, as well as a method for designing the same. In some embodiments, the multi-zone GDP comprises a body with a plurality of holes. The holes extend through the body, from a lower or bottom surface of the body to an upper or top surface of the body. The multi-zone GDP further comprises a plurality of zones into which the holes are grouped. The zones are laterally arranged around a periphery of the body and comprise a first zone and a second zone. Holes of the first zone share a first cross-sectional profile and holes of the second zone share a second cross-sectional profile different than the first cross-sectional profile.

Advantageously, boundaries of the zones and the cross-sectional profiles of the holes may be designed to compensate for non-uniform plasma in a process chamber, including non-uniformities due to a layout of the process chamber. For example, the first cross-sectional profile may be reduced in width, thereby reducing process gas flow to the first zone, in response to historically high plasma intensity under the first zone. Accordingly, the multi-zone GDP may improve etching uniformity during bulk manufacture of MEMS motion sensors, thereby facilitating increases in sensitivity and accuracy of gyroscopes and accelerometers upon which the MEMS motion sensors depend.

Figure 1:
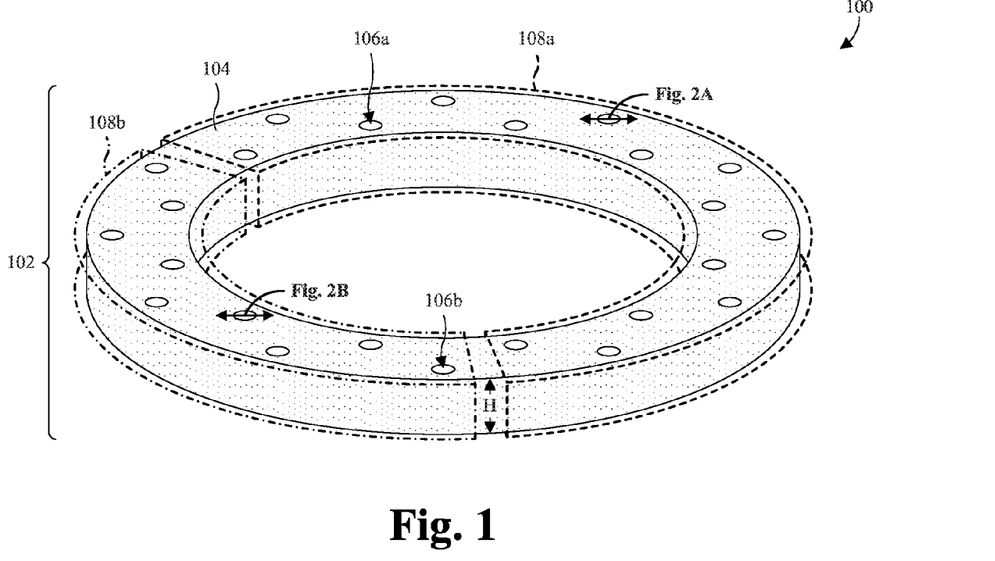
FIG. 1 illustrates a perspective view of some embodiments of a multi-zone gas distribution plate (GDP) with two zones.

With reference to FIG. 1, a perspective view 100 of some embodiments of a multi-zone GDP 102 is provided. As illustrated, the multi-zone GDP 102 comprises a body 104 within which a plurality of holes 106a, 106b is arranged. In some embodiments, the body 104 extends laterally from an inner sidewall to an outer sidewall that laterally surrounds the inner sidewall. For example, the body 104 may be annular or ring-shaped. In other embodiments, an interior of the body 104 is continuous. For example, the body 104 may be cylindrical, square, or rectangular. Further, in some embodiments, the body 104 has a uniform height H, and/or is a ceramic, a metal, or a dielectric.

The holes 106a, 106b extend through the body 104, from a lower or bottom surface of the body 104 to an upper or top surface of the body 104, and comprise respective cross-sectional profiles. In some embodiments, the holes 106a, 106b are uniformly spaced, and/or have a cylindrical shape or a rectangular cuboid shape. Further, in some embodiments, the cross-sectional profiles increase in width towards the lower or bottom surface of the body 104. The holes 106a, 106b are grouped into a plurality of zones 108a, 108b by the cross-sectional profiles, such that holes 106a, 106b sharing a common cross-sectional profile are grouped together.

The zones 108a, 108b are laterally arranged along a periphery of the body 104 and respectively represent different ones of the cross-sectional profiles. The zones 108a, 108b each comprise at least one of the holes 106a, 106b and, in some embodiments, one or more of the zones 108a, 108b each comprise a plurality of the holes 106a, 106b. Further, the zones 108a, 108b comprise a first zone 108a representing a first one of the cross-sectional profiles, and further comprise a second zone 108b representing a second one of the cross-sectional profiles. In some embodiments, the zones 108a, 108b comprise one or more additional zones. One or more first holes 106a of the first zone 108a share the first cross-sectional profile, and one or more second holes 106b of the second zone 108b share the second cross-sectional profile. In some embodiments, the first and second zones 108a, 108b are continuous or discontinuous. In other embodiments, one of the first and second zones 108a, 108b is continuous and another one of the first and second zones 108a, 108b is discontinuous.

Advantageously, boundaries of the zones 108a, 108b and the cross-sectional profiles of the holes 106a, 106b may be designed to compensate for non-uniform plasma in a process chamber, including non-uniformities due to a layout of the process chamber. For example, a width of the first cross-sectional profile may be larger than that of the second-cross-sectional profile to increase process gas flowing through the first zone 108a, and hence to compensate for historically low plasma intensity under the first zone 108a relative to the second zone 108b. Accordingly, the multi-zone GDP 102 may improve etching uniformity, which may also facilitate an increase in performance of MEMS motions sensors during bulk manufacture.

While the multi-zone GDP 102 of FIG. 1 is illustrated with two zones 108a, 108b, and the zones 108a, 108b were illustrated as continuous, it is to be appreciated that additional zones and/or discontinuous zones are amenable. For example, the multi-zone GDP 102 may comprise two continuous zones and one discontinuous zone. Further, while multi-zone GDP 102 of FIG. 1 is targeted for use with plasma-based etching, the multi-zone GDP 102 may be employed with other plasma-based processes in which uniform plasma is desired. For example, the multi-zone GDP 102 may be employed with plasma activation.

Figure 2A:
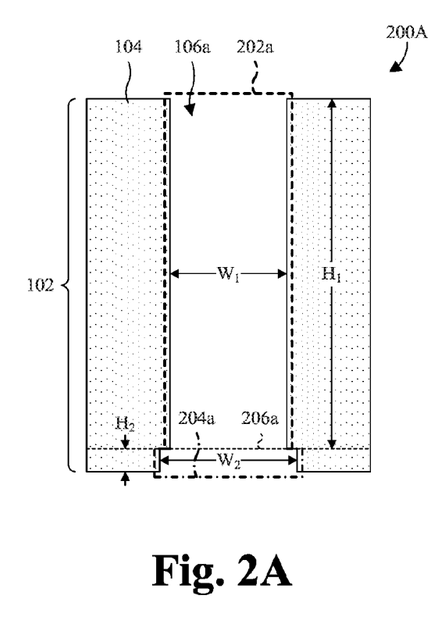
FIGS. 2A and 2B illustrate cross-sectional views of holes in the multi-zone GDP of FIG. 1 that correspond to first and second zones of the multi-zone GDP.
Figure 2B:
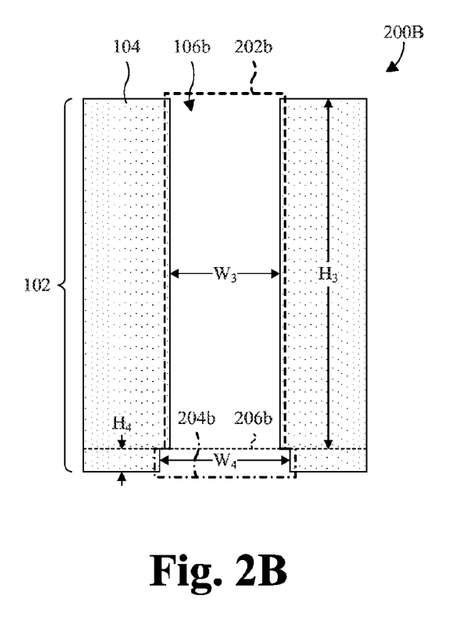

With reference to FIGS. 2A and 2B, cross-sectional views 200A, 200B of some embodiments of first and second holes 106a, 106b respectively having the first and second cross-sectional profiles of FIG. 1 are provided. As illustrated, the first and second holes 106a, 106b increase in width from an upper or top surface of a multi-zone GDP 102 to a lower or bottom surface of the multi-zone GDP 102. The first and second holes 106a, 106b each comprise a first region 202a, 202b and a second region 204a, 204b underlying the first region 202a, 202b. The first region 202a, 202b extends vertically from the upper or top surface of the multi-zone GDP 102 to a boundary or transition region 206a, 206b between the first and second regions 202a, 202b, 204a, 204b, and has a first width $W_1$, $W_3$ and a first height $H_1$, $H_3$. The second region 204a, 204b extends vertically from the boundary or transition region 206a, 206b between the first and second regions 202a, 202b, 204a, 204b to the lower or bottom surface of the multi-zone GDP 102, and has a second width $W_2$, $W_4$ and a second height $H_2$, $H_4$.

The second width $W_2$, $W_4$ is greater than the first width $W_1$, $W_3$, and the second height $H_2$, $H_4$ is less than the first height $H_1$, $H_3$. In some embodiments, the first width $W_1$, $W_3$ is between about 0.40-0.60 millimeters, between about 0.45-0.55 millimeters, or between about 0.45-0.50 millimeters, and the second width $W_2$, $W_4$ is between about between about 0.45-0.55 millimeters or between about 0.48-0.52 millimeters. For example, the first width $W_1$, $W_3$ may be about 0.46, 0.48, or 0.50 millimeters, and the second width $W_2$, $W_4$ may be about 0.50 or 0.52 millimeters. Further, in some embodiments, the first height $H_1$, $H_3$ is about 10-20 or 14-16 times larger than the second height $H_2$, $H_4$. For example, the first height $H_1$, $H_3$ may be about 1.5 micrometers and the second height $H_2$, $H_4$ may be about 0.1 micrometers.

The first and second cross-sectional profiles of the first and second holes 106a, 106b are configured to compensate for non-uniform plasma during plasma-based etching. Increasing a width $W_1$, $W_2$, $W_3$, $W_4$ of the first or second hole 106a, 106b may, for example, increase a flow of process gases through the first or second hole 106a, 106b, thereby increasing a plasma intensity and/or density proximate the first or second hole 106a, 106b. Decreasing a width $W_1$, $W_2$, $W_3$, $W_4$ of the first or second hole 106a, 106b may, for example, decrease a flow of process gases through the first or second hole 106a, 106b, thereby decreasing a plasma intensity and/or density proximate the first or second hole 106a, 106b. Accordingly, in some embodiments, the first width $W_1$ and/or the second width $W_2$ of the first hole 106a is greater than the first width $W_3$ and/or the second width $W_4$ of the second hole 106b to compensate for low plasma intensity and/or density under the first hole 106a. For example, the first and second widths $W_1$, $W_2$ of the first hole 106a may respectively be about 0.50 millimeters and about 0.52 millimeters, and the first and second widths $W_3$, $W_4$ of the second hole 106b may respectively be about 0.48 millimeters and about 0.50 millimeters.

Figure 3:
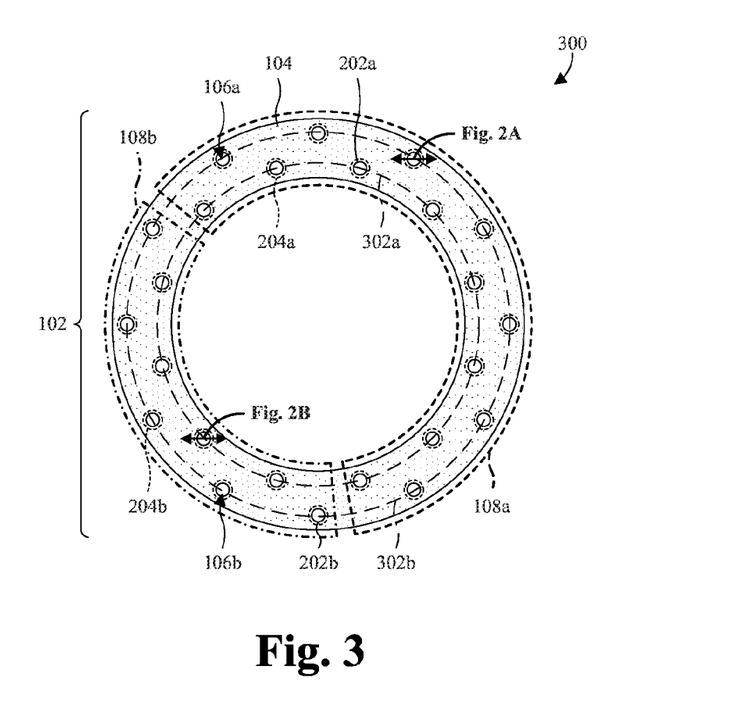
FIG. 3 illustrates a top view of some embodiments of the multi-zone GDP of FIG. 1.

With reference to FIG. 3, a top view 300 of some embodiments of the multi-zone GDP 102 of FIG. 1 is provided. As illustrated, the multi-zone GDP 102 comprises a plurality of holes 106a, 106b arranged in a body 104. The holes 106a, 106b extend through the body 104 and increase in width between the upper or top surface of the body 104 and the lower or bottom surface of the body 104. Regions 204a, 204b of the holes 106a, 106b with increased width are shown in phantom. Further, the holes 106a, 106b are evenly spaced along a periphery of the body 104 and are grouped into zones 108a, 108b. In some embodiments, where the periphery is circular, the holes 106a, 106b are arranged in two circles 302a, 302b that are concentric with the periphery, uniformly alternate between the two concentric circles 302a, 302b, and are evenly spaced laterally along the respective concentric circles 302a, 302b.

The zones 108a, 108b are laterally spaced along the periphery of the body 104 and comprise a first zone 108a and a second zone 108b. The first zone 108a comprises one or more first holes 106a that share a first cross-sectional profile, and the second zone 108b comprises one or more second holes 106b that share a second cross-sectional profile different than the first cross-sectional profile. Further, in some embodiments, the first and second zones 108a, 108b extend continuously between respective ends without an intervening hole that has a different cross-sectional profile.

Figure 4:
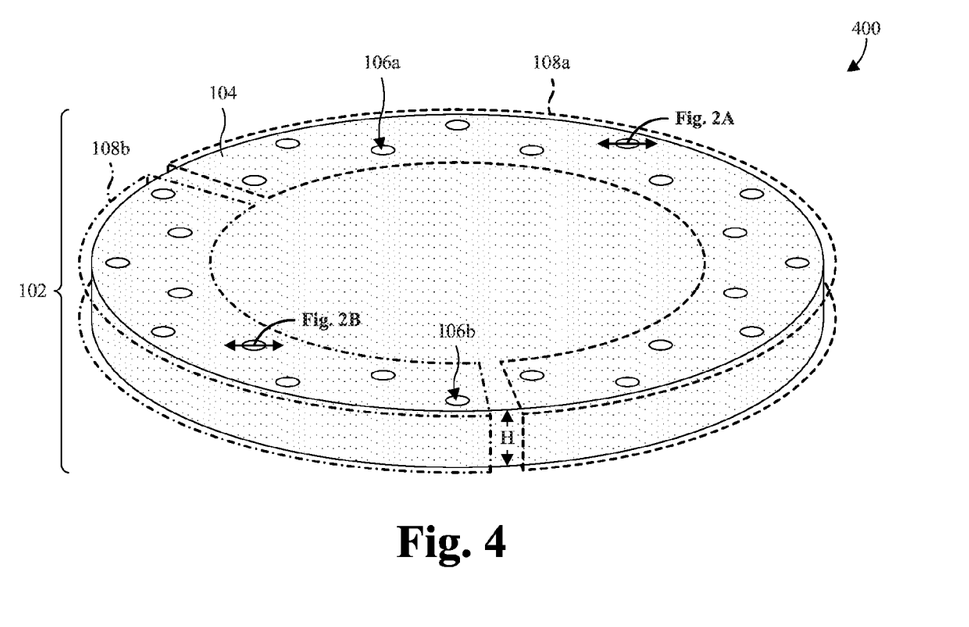
FIG. 4 illustrates a perspective view of other embodiments of the multi-zone GDP of FIG. 1 in which a body of the multi-zone GDP is cylindrical.

With reference to FIG. 4, a perspective view 400 of other embodiments of the multi-zone GDP 102 of FIG. 1 is provided in which a body 104 of the multi-zone GDP 102 is cylindrical. As illustrated, holes 106a, 106b are arranged in the body 104 according to a ring-shaped pattern and extend through the body 104. Further, the holes 106a, 106b are grouped into zones 108a, 108b by respective cross-sectional profiles. The zones 108a, 108b are arranged along a periphery of the body 104.

Figure 5:
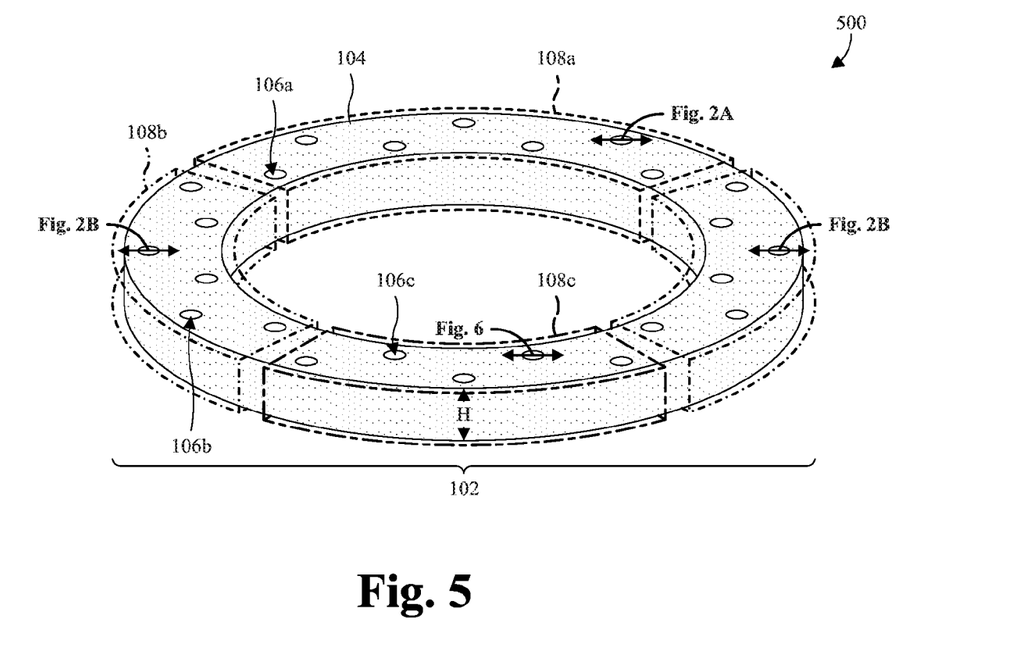
FIG. 5 illustrates a perspective view of other embodiments of the multi-zone GDP of FIG. 1 in which the multi-zone GDP comprises three zones.

With reference to FIG. 5, a perspective view 500 of yet other embodiments of the multi-zone GDP 102 of FIG. 1 is provided in which holes 106a, 106b, 106c of the multi-zone GDP 102 are grouped into three zones 108a, 108b, 108c. As illustrated, the zones 108a, 108b, 108c comprise a first zone 108a, a second zone 108b, and a third zone 108c. The first, second, and third zones 108a, 108b, 108c respectively comprise one or more first holes 106a sharing a first cross-sectional profile, one or more second holes 106b sharing a second cross-sectional profile, and one or more third holes 106c sharing a third cross-sectional profile. The first, second, and third cross-sectional profiles are different and configured to compensate for non-uniformities in underlying plasma. The first zone 108a, the second zone 108b, the third zone 108c, or a combination of the foregoing may be continuous, and/or the first zone 108a, the second zone 108b, the third zone 108c, or a combination of the foregoing may be discontinuous. For example, the first and third zones 108a, 108c may be continuous, and the second zone 108b may be discontinuous with a pair of segments separated by the first and third zones 108a, 108c.

Figure 6:
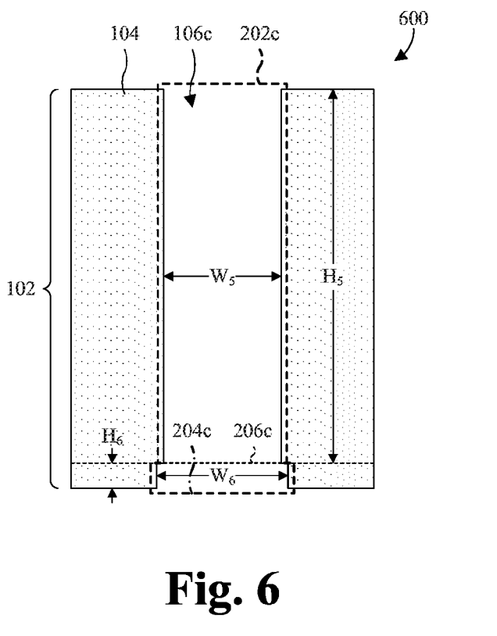
FIG. 6 illustrates a cross-sectional view of a hole in the multi-zone GDP of FIG. 5 that corresponds to a third zone of the multi-zone GDP.

With reference to FIG. 6, a cross-sectional view 600 of some embodiments of a third hole 106c having the third cross-sectional profile of FIG. 5 is provided. As illustrated, the third hole 106c increases in width from an upper or top surface of a multi-zone GDP 102 to a lower or bottom surface of the multi-zone GDP 102. The third hole 106c comprises a first region 202c and a second region 204c underlying the first region 202c. The first region 202c extends vertically from the upper or top surface of the multi-zone GDP 102 to a boundary or transition region 206c between the first and second regions 202c, 204c, and has a first width $W_5$ and a first height $H_5$. The second region 204c extends vertically from the boundary or transition region 206c between the first and second regions 204c to the lower or bottom surface of the multi-zone GDP 102, and has a second width $W_6$ and a second height $H_6$. The first and second widths $W_5$, $W_6$ may be, for example, as described with regard to the first and second holes 106a, 106b of FIGS. 2A and 2B.

The third cross-sectional profile is configured to compensate for non-uniform plasma during plasma-based etching, and is different than the first and second cross-sectional profiles respectively of FIGS. 2A and 2B. In some embodiments, the first width $W_1$ and/or the second width $W_2$ of the first hole 106a in FIG. 2A is greater than the first width $W_3$ and/or the second width $W_4$ of the second hole 106b in FIG. 2B, and the first width $W_3$ and/or the second width $W_4$ of the second hole 106b is greater than the first width and/or the second width of the third hole 106c. For example, the first and second widths $W_1$, $W_2$ of the first hole 106a may respectively be about 0.50 millimeters and about 0.52 millimeters, the first and second widths $W_3$, $W_4$ of the second hole 106b may respectively be about 0.48 millimeters and about 0.50 millimeters, and the first and second widths $W_5$, $W_6$ of the third hole 106c may respectively be about 0.46 millimeters and about 0.50 millimeters.

Figure 7:
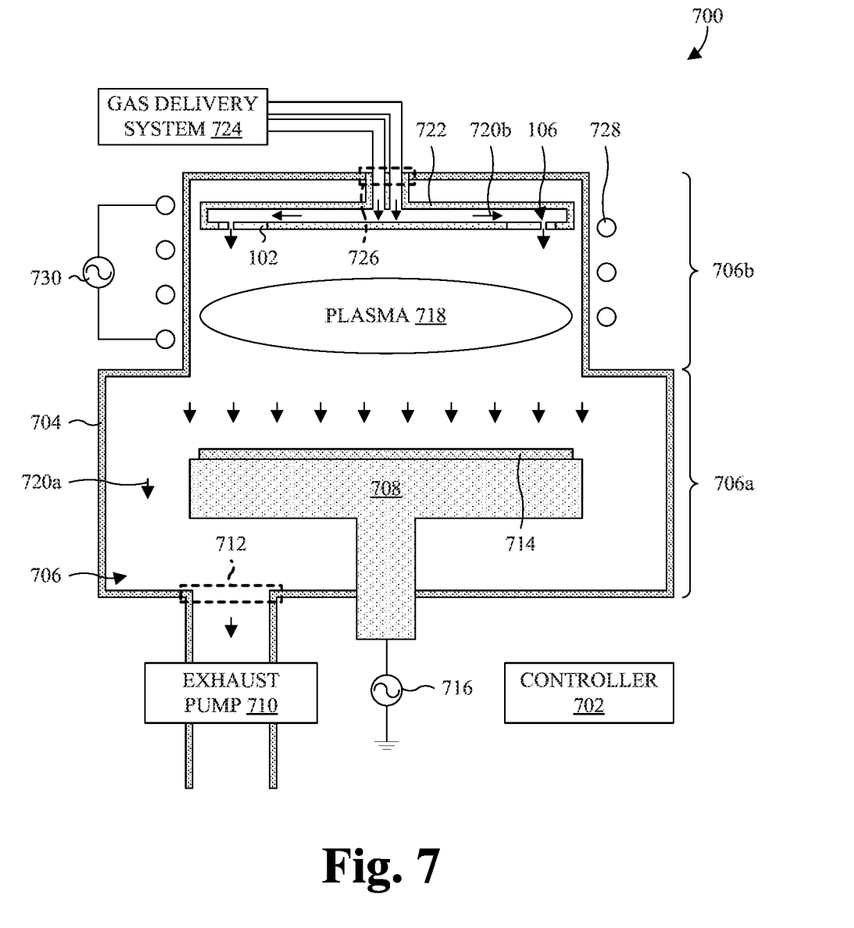
FIG. 7 illustrates a cross-sectional view of some embodiments of a plasma-based process tool with a multi-zone GDP.
Figure 8A:
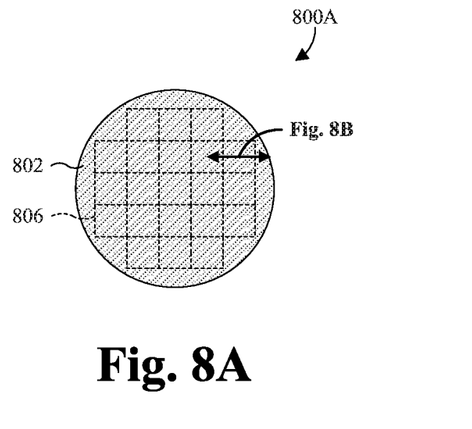
FIGS. 8A, 8B, 9A, 9B, 10A, and 10B illustrate a series of cross-sectional and top views of some embodiments of a method for forming a semiconductor device feature in a substrate using a multi-zone GDP.
Figure 8B:
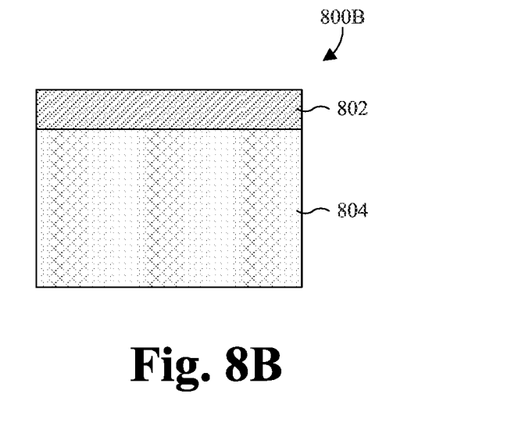

With reference to FIG. 7, a cross-sectional view 700 of some embodiments of a plasma-based process tool within which the multi-zone GDP 102 of FIG. 1 may be employed is provided. The process tool is configured to perform plasma-based etching, such as, for example, deep reactive ion etching (DRIE) or plasma etching. Further, in some embodiments, the process tool is configured to perform a Bosh process. As illustrated, the process tool is controlled by a controller 702 and comprises a housing 704 defining a process chamber 706. The controller 702 may be, for example, a microcontroller, a computer processor running control software, an application-specific integrated circuit (ASIC), or some other electronic device.

A lower region 706a of the process chamber 706 accommodates a workpiece support 708 and is connected to an exhaust pump 710 through a gas outlet 712 of the housing 704. The workpiece support 708 is configured to support a workpiece 714 and, in some embodiments, is or otherwise comprises an electrode. The workpiece 714 may be, for example, a 350 millimeter or 450 millimeter semiconductor wafer. The electrode may be, for example, electrically coupled to a first radio frequency (RF) source 716 configured to promote the migration of particles from overlying plasma 718 towards the workpiece support 708. The exhaust pump 710 is configured to remove gases 720a from the process chamber 706 and/or to otherwise control a pressure of the process chamber 706 relative to an ambient environment of the process tool.

An upper region 706b of the process chamber 706 overlies the lower region 706a and accommodates the multi-zone GDP 102. In some embodiments, the upper region 706b has a smaller width and/or footprint (i.e., projection onto a horizontal plane) than the lower region 706a. The multi-zone GDP 102 is, or is otherwise arranged in, a showerhead structure 722 configured to receive process gases 720b from a gas delivery system 724 through one or more gas inlets 726 of the housing 704. The process gases 720b may include, for example, sulfur hexafluoride ($SF_6$) and/or octofluorocyclobutane ($C_4F_8$). Further, the multi-zone GDP 102 is configured to distribute the process gases 720b received by the showerhead structure 722 into the process chamber 706 through holes 106 of the multi-zone GDP 102.

A spiral inductor 728 laterally spirals around the upper region 706b of the process chamber 706 and is electrically coupled to a second RF source 730. The spiral inductor 728 is configured to excite the process gases 720b, thereby producing the plasma 718 with a high density in the upper region 706b of the process chamber 706. In operation, the plasma 718 interfaces with the workpiece 714 on the workpiece support 708 to perform plasma-based etching and. For example, the plasma 718 may chemically react with the workpiece 714 to remove material from the workpiece 714. As another example, particles of the plasma 718 may be accelerated towards the workpiece 714 by the first RF source 716, such that physical bombardment of the particles removes material from the workpiece 714. As yet another example, chemical reaction of the workpiece 714 with the plasma 718 and bombardment of the workpiece 714 with particles of the plasma 718 may be employed to remove material.

While the foregoing described the process tool as generating the plasma 718 with an inductively coupled plasma (ICP) source, the plasma 718 may be generated by another type of plasma source. Additionally, while the foregoing was focused on DRIE, other types of plasma-based processes are amenable. For example, the plasma tool may be used with plasma etching, reactive ion etching (RIE), or plasma activation. Even more, in other embodiments, the upper region 706b of the process chamber 706, the spiral inductor 728, and the second RF source 730 are omitted, such that the multi-zone GDP 102 and/or the showerhead structure 722 are arranged to the lower region 706a of the process chamber 706.

With reference to FIGS. 8A-10B, a series of top views 800A, 900A, 1000A and cross-sectional views 800B, 900B, 1000B illustrate some embodiments of a method for using the plasma-based process tool of FIG. 7. As illustrated by the views 800A, 800B of FIGS. 8A and 8B, a photoresist layer 802 is formed over a substrate 804 by a deposition process tool. In some embodiments, the substrate 804 is a semiconductor wafer, such as a bulk silicon wafer, or comprises a semiconductor wafer and one or more layers and/or features arranged thereover. Further, in some embodiments, the substrate 804 comprises multiple integrated circuit (IC) die regions 806. The photoresist layer 802 may be formed by, for example, spin coating.

Figure 9A:
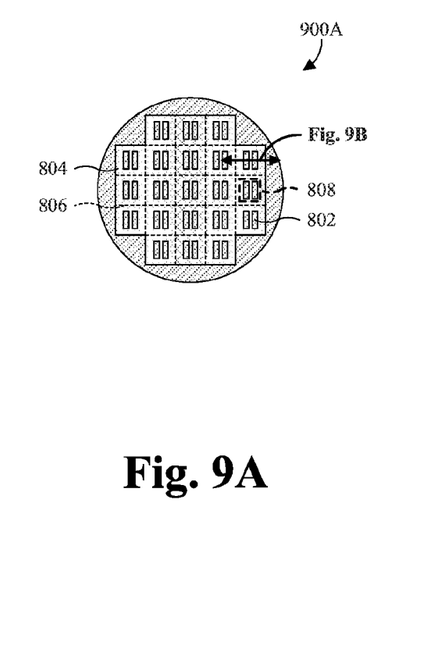
Figure 9B:
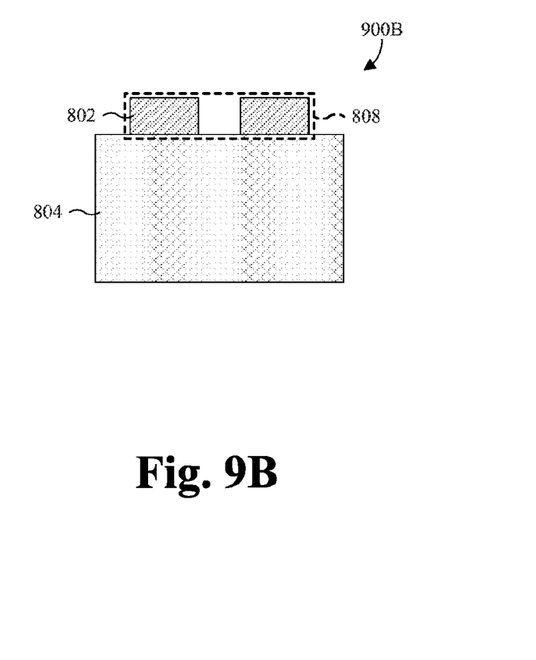

As illustrated by the views 900A, 900B of FIGS. 9A and 9B, a mask pattern is repeatedly transferred to the photoresist layer 802 through selective exposure of the photoresist layer 802 to radiation (e.g., light), thereby forming a photoresist mask 808 over each of the IC die regions 806. In some embodiments, the selective exposure is performed by a lithography process tool. Further, in some embodiments, the exposure energy varies by IC die region or location over by substrate 804 according to an exposure map. The exposure map describes exposure energy as a function of IC die region or location over the substrate 804.

Figure 10A:
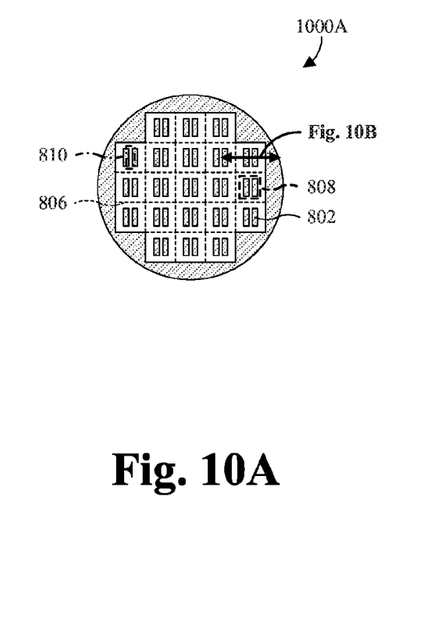
Figure 10B:
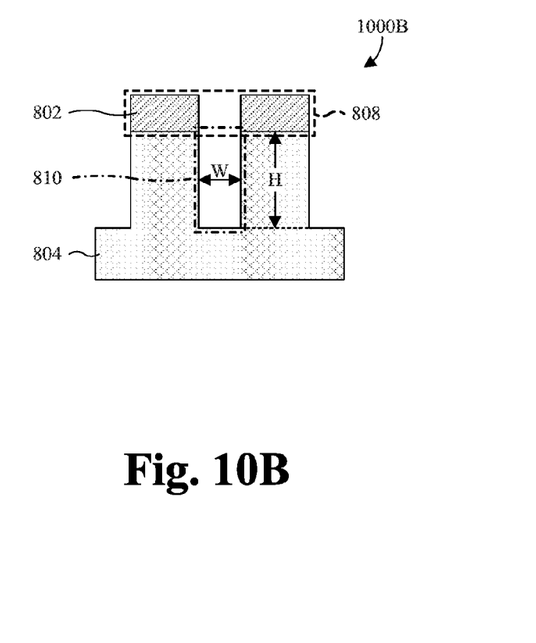

As illustrated by the views 1000A, 1000B of FIGS. 10A and 10B, a plasma-based etch is performed into the substrate 804 with the photoresist masks 808 in place, thereby forming a feature 810 in each of the IC die regions 806. In some embodiments, the plasma-based etch is performed by the plasma-based process tool of FIG. 7 and/or using the multi-zone GDP 102 of FIGS. 1, 2A, 2B, and 3-6. Further, in some embodiments, the feature 810 is an opening in the substrate 804 or a proof mass defined within the substrate 804. By employing the multi-zone GDP 102, plasma uniformity is high, such that a uniformity of the features 810 is high between the IC die regions 806. For example, a dimension, such as a width W or a height H, of the features 810 is highly uniform between the IC die regions 806.

In some embodiments, the exposure map also facilitates a high uniformity of the features 810 between the IC die regions 806 since the exposure map may be designed to compensate for non-uniformities in the features 810 between the IC die regions 806. For example, where a feature 810 is an opening and is historically small within an IC die region 806, increased exposure energy over the IC die region 806 reduces a size of the respective photoresist mask 808, thereby increasing a size of the feature 810. As another example, where a feature 810 is an opening and is historically large within an IC die region 806, decreased exposure energy over the IC die region 806 increases a size of the respective photoresist mask 808, thereby decreasing a size of the feature 810.

In some embodiments, a feature 810 of an IC die region 806 is characterized as large or small through comparison of a dimension of the feature 810, such as width or height, to a normal or reference value range for the dimension. For example, the feature 810 may be large if the dimension is greater than the normal or reference value range and small if the dimension is less that the normal or reference value range. The normal or reference value range may, for example, extend from an average or expected value of the dimension minus a standard or target deviation of the dimension to the average or expected value plus the standard or target deviation. The average value and the standard deviation may be, for example, statistically calculated across the IC die regions 806. The expected value may be determined by, for example, computer simulation, and/or the target deviation may be, for example, user specified.

Figure 11:
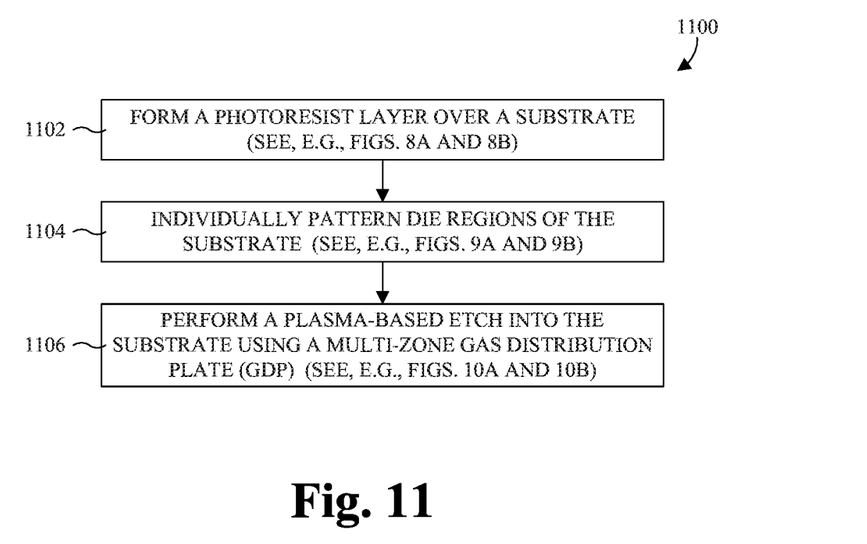
FIG. 11 illustrates a flowchart of some embodiments of the method of FIGS. 8A, 8B, 9A, 9B, 10A, and 10B.

With reference to FIG. 11, a flowchart 1100 of some embodiments of the method of FIGS. 8A-10B is provided. At 1102, a photoresist layer is formed over a substrate. See, for example, FIGS. 8A and 8B. At 1104, die regions of the substrate are individually patterned. In some embodiments, the patterning is performed using an exposure map. See, for example, FIGS. 9A and 9B. At 1106, a plasma-based etch is performed into the substrate using a multi-zone GDP. See, for example, FIGS. 10A and 10B.

Figure 12:
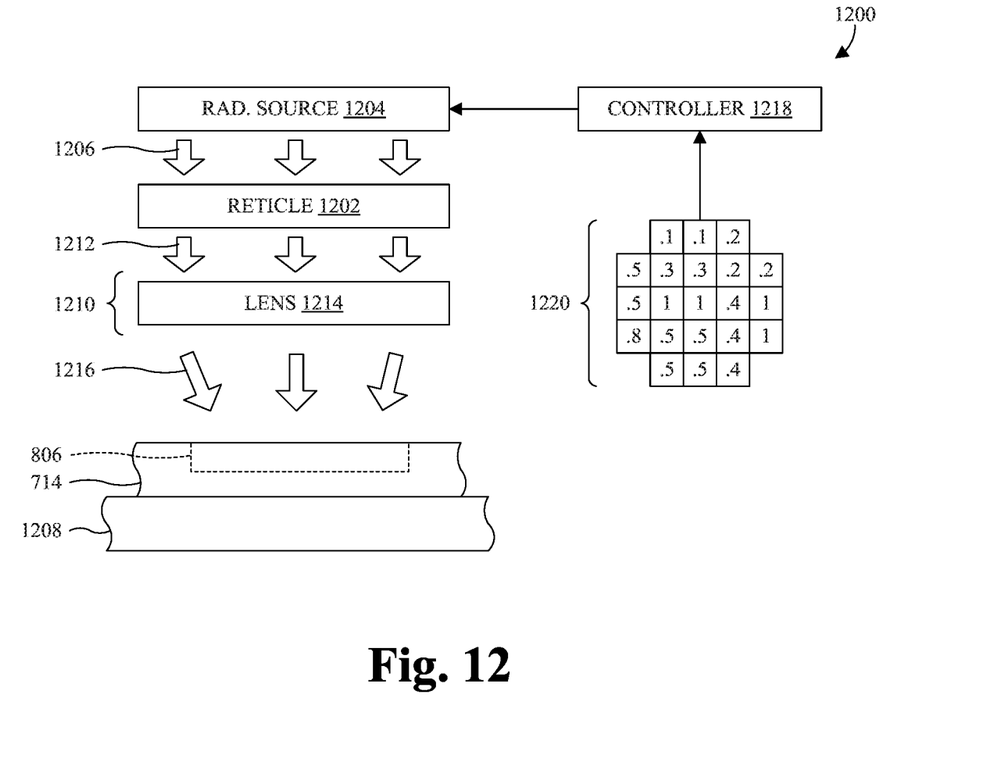
FIG. 12 illustrates a cross-sectional view of some embodiments of a lithography process tool with an exposure map.

With reference to FIG. 12, a block diagram 1200 of some embodiments of a lithography process tool is provided. As illustrated, the process tool is configured to repeatedly transfer a pattern of a reticle 1202 to different IC die regions 806 of a workpiece 714. A radiation source 1204 is configured to emit radiation 1206, such as, for example, light, towards the reticle 1202, and the reticle 1202 is configured to selectively transmit the radiation 1206 according to the pattern. A wafer support 1208 is configured to support and, in some embodiments, move the workpiece 714. An optical transfer system 1210 is configured to transfer patterned radiation 1212 to the workpiece 714. The optical transfer system 1210 may comprise, for example, a lens 1214 and/or a liquid distribution system (not shown). The lens 1214 may, for example, be configured to focus the patterned radiation 1212 on an IC die region 806 of the workpiece 714, such that focused radiation 1216 impinges on the IC die region 806.

A controller 1218 is configured to control the repeated transfer of the pattern to the different IC die regions 806 of the workpiece 714. In some embodiments, the controller 1218 controls the repeated transfer according to an exposure map 1220 to improve subsequent etching uniformity. The exposure map 1220 describes exposure energy (e.g., 0.1, 0.5, etc.) as a function of location on the workpiece 714. For example, the exposure map 1220 may describe exposure energy as a function of IC die region 806. In some embodiments, exposure energy is defined as exposure duration (e.g., in seconds) multiplied by exposure intensity (e.g., in lumens). The controller 1218 may control the repeated transfer by coordinating the intensity of the radiation source 1204, a duration with which the radiation source 1204 is active, movement of the workpiece 714 with the wafer support 1208, or a combination of the foregoing.

Figure 13A:
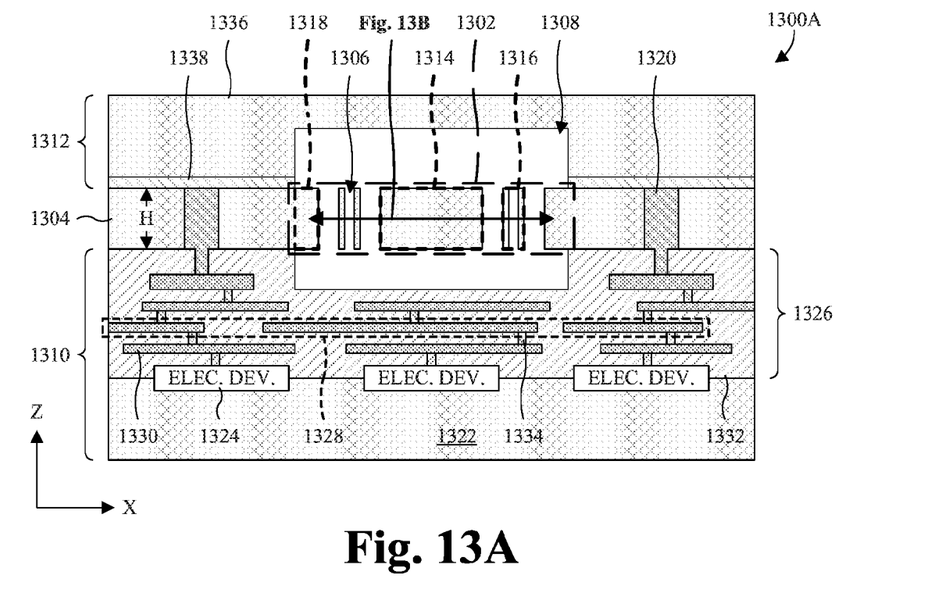
FIGS. 13A and 13B respectively illustrate a cross-sectional view and a top view of a microelectromechanical systems (MEMS) device formed with a multi-zone GDP.
Figure 13B:
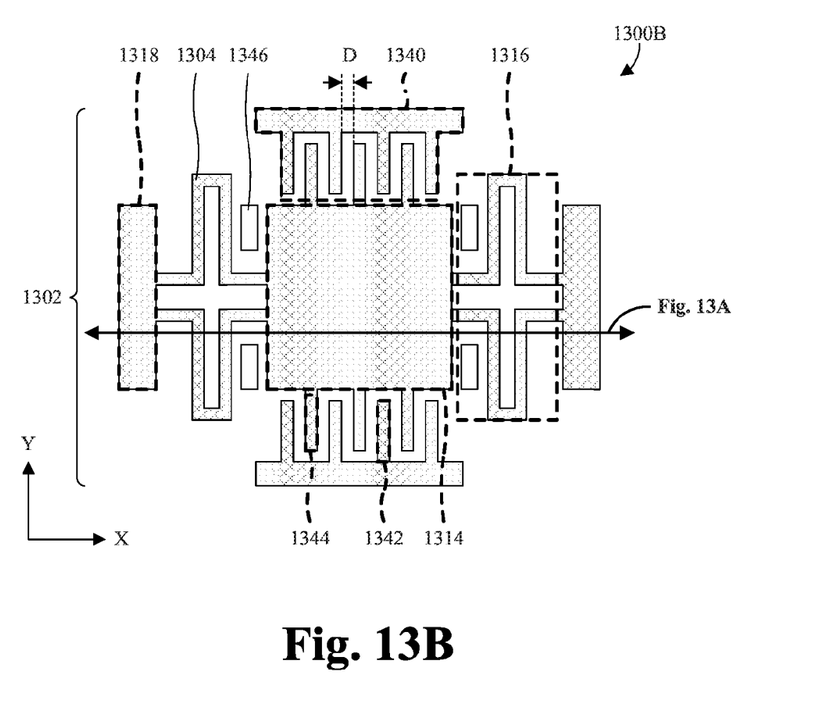

With reference to FIGS. 13A and 13B, a cross-sectional view 1300A and a top view 1300B of some embodiments of an IC with a MEMS motion sensor 1302 are respectively provided. The MEMS motion sensor 1302 may, for example, be formed using the plasma-based process tool of FIG. 7 and/or the lithography process tool of FIG. 12.

As illustrated by FIG. 13A, the MEMS motion sensor 1302 is arranged within a first substrate 1304 and is defined by openings 1306 extending through the first substrate 1304. Further, the MEMS motion sensor 1302 is arranged within a cavity 1308 defined between an IC chip 1310 supporting the first substrate 1304 and a cap chip 1312 covering the first substrate 1304. The first substrate 1304 may be, for example, a bulk semiconductor substrate, such as a bulk silicon substrate, and/or may have, for example, a height H between 10 micrometers to 0.5 millimeters. The MEMS motion sensor 1302 comprises a proof mass 1314 suspended within the cavity 1308 by springs 1316 anchored to anchors 1318 at a periphery of the cavity 1308. Further, the MEMS motion sensor 1302 comprises electrodes (not shown) electrically coupled to the IC chip 1310 by through substrate vias (TSVs) 1320 extending through the first substrate 1304. The TSVs 1320 may, for example, be a metal, such as copper or aluminum copper.

The IC chip 1310 comprises a second substrate 1322 supporting a plurality of electronic devices 1324, and further comprises an interconnect structure 1326 covering the second substrate 1322 and the electronic devices 1324. The IC chip 1310 may be, for example, an application-specific IC (ASIC), and/or the second substrate 1322 may be, for example, a bulk semiconductor substrate, such as a bulk silicon substrate. The electronic devices 1324 are configured to control operation of the MEMS motion sensor 1302, and may be, for example, transistors. The interconnect structure 1326 comprises multiple layers 1328 of conductive features 1330 vertically stacked within an interlayer dielectric (ILD) region 1332. The ILD region 1332 comprises a first recess defining a lower portion of the cavity 1308 and may be, for example, a low κ dielectric (i.e., a dielectric with a dielectric constant κ less than about 3.9) or silicon dioxide. The conductive features 1330 are connected to one another and the electronic devices 1324 by vias 1334 and may be, for example, metal lines. The conductive features 1330 and the vias 1334 may be, for example, a metal, such as copper or aluminum copper.

The cap chip 1312 comprises a third substrate 1336 with a second recess defining an upper portion of the cavity 1308. The third substrate 1336 may be, for example, a bulk semiconductor substrate, such as a bulk silicon substrate. Further, in some embodiments, the cap chip 1312 comprises a dielectric layer 1338 lining a lower or bottom surface of third substrate 1336 and is bonded to the first substrate 1304 through the dielectric layer 1338. The dielectric layer 1338 laterally surrounds the cavity 1308 and may be, for example, silicon dioxide.

As illustrated by FIG. 13B, the proof mass 1314 is laterally spaced between two comb drives 1340 in a first direction (e.g., a Y direction). The comb drives 1340 are defined by fixed finger electrodes 1342 interdigitated with movable finger electrodes 1344 protruding from the proof mass 1314. In some embodiments, lateral distances D between opposing sidewall surfaces of the fixed and movable finger electrodes 1342, 1344 is about 1.46-1.54 micrometers. The comb drives 1340 are configured to oscillate the proof mass in the Y direction in response to an alternating drive signal applied between the fixed and movable finger electrodes 1342, 1344. The drive signal may, for example, have a frequency between about 26.8-27.2 kilohertz.

The proof mass 1314 is also laterally spaced between two anchors 1318 in a second direction (e.g., an X direction) that is orthogonal to the first direction, and is connected to the anchors 1318 by springs 1316 intermediate the proof mass 1314 and the anchors 1318. In some embodiment, the anchors 1318 are configured to ground the proof mass 1314 through the springs 1316. Sensing electrodes 1346 are laterally spaced in the second direction between the springs 1316 and the proof mass 1314, and are capacitively coupled with the proof mass 1314. The sensing electrodes 1346 are configured to sense oscillations of the proof mass 1314. Such oscillations may, for example, vary based on the Coriolis Effect.

Forming the IC with the plasma-based process tool of FIG. 7 and/or the lithography process tool of FIG. 12 allows for high uniformity in critical dimensions during bulk manufacture. For example, the openings 1306 or the distance D may be highly uniform between IC die regions during bulk manufacture. Such high uniformity advantageously allows for high sensitivity and/or accuracy. Further, while FIGS. 13A and 13B were described with regard to a MEMS motion sensor, other types of MEMS devices are amenable. Even more, while the IC chip 1310 was described as supporting the first substrate 1304, the IC chip 1310 may be replaced with a bulk substrate and the cap chip 1312 may be augmented to include electronic devices and an interconnect structure as described with regard to the IC chip 1310.

Figure 14:
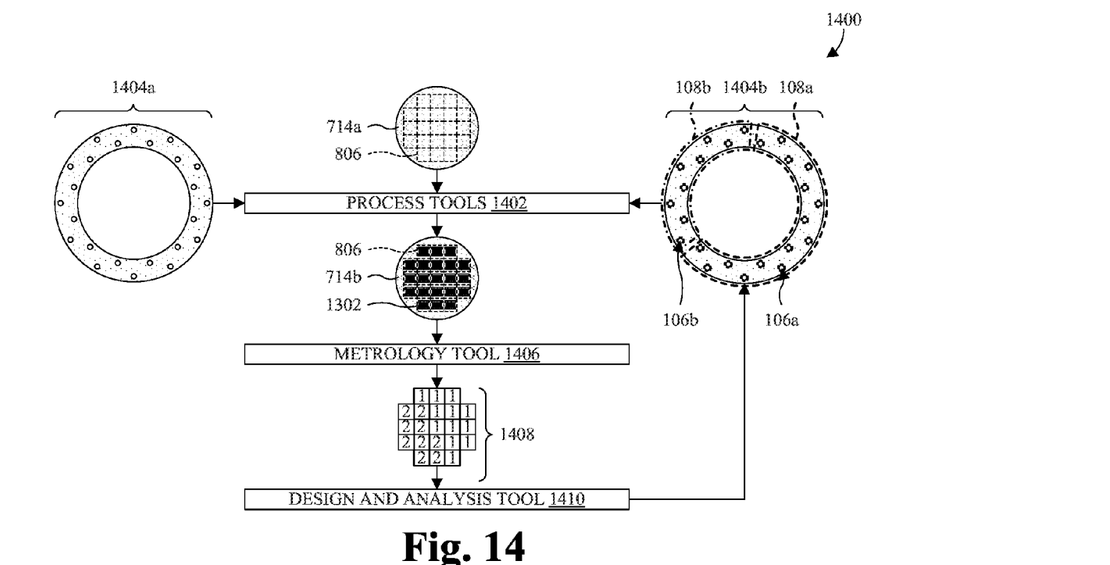
FIG. 14 illustrates a block diagram of a method for designing a multi-zone GDP.

With reference to FIG. 14, a block diagram 1400 illustrates some embodiments of a method for designing a multi-zone GDP. The multi-zone GDP may be, for example, as described in FIGS. 1, 2A, 2B, and 3-6, and/or may be used in the plasma-based process tool of FIG. 7. As illustrated, process tools 1402 perform a series of semiconductor manufacturing processes on an initial workpiece 714a such that a resulting workpiece 714b has a plurality of MEMS motion sensors 1302 distributed thereover in respective IC die regions 806. The initial workpiece 714a may be, for example, a semiconductor wafer, such as a silicon wafer, and/or may have, for example, a size of 350 or 450 millimeters. The MEMS motion sensors 1302 may be, for example, configured as described in FIGS. 13A and 13B.

The process tools 1402 include a process tool for plasma-based etching, such as, for example, the plasma-based process tool of FIG. 7. While performing the series of semiconductor manufacturing processes, the process tool performs plasma-based etching with an initial GDP 1404a to define layouts of the MEMS motion sensors 1302. The initial GDP 1404a is configured to distribute process gases into a process chamber of the process tool, thereby facilitating the formation of uniform plasma in the process chamber. In some embodiments, the initial GDP 1404a is a multi-zone GDP, such as the multi-zone GDP 102 of FIG. 1. In other embodiments, the initial GDP 1404a is a single-zone GDP.

After performing the series of semiconductor manufacturing processes, a metrology tool 1406 performs a circuit probe (CP) test on the resulting workpiece 714b to test the MEMS motion sensors 1302 and to generate a CP map 1408. The CP map 1408 describes a test parameter of the MEMS motion sensors 1302 as a function of location on the resulting workpiece 714b. For example, the CP map 1408 may describe the test parameter as a function of IC die region on the resulting workpiece 714b. The test parameter varies with process variation and may, for example, be drive frequency, sense frequency, or critical dimension. Drive frequency is, for example, a frequency applied to a comb drive (e.g., comb drive 1340 in FIG. 13B) of a MEMS motion sensor, and/or sense frequency is, for example, a frequency sensed by sensing electrodes (e.g., sensing electrodes 1346 in FIG. 13B) of the MEMS motion sensor. Critical dimension is, for example, a dimension of an opening or feature formed by the plasma-based etching (e.g., dimension D in FIG. 13B).

A design and analysis tool 1410 receives the CP map 1408 and determines whether to refine the initial GDP 1404a. In some embodiments, the design and analysis tool 1410 bases the determination on yield or uniformity of the CP map 1408. For example, the initial GDP 1404a may be refined if a difference between a center value of the CP map 1408 and an edge value of the CP map 1408 is greater than about 5% of a mean value of the center and edge values. Further, in some embodiments, the design and analysis tool 1410 is an ASIC, a microcontroller, a programmed computer processor, or some other electronic device configured to carry out the functionality described herein.

If the design and analysis tool 1410 determines that refinement is inappropriate, the initial GDP 1404a may be put into production and used to form the MEMS motion sensors 1302. Otherwise, the initial GDP 1404a is refined into a refined GDP 1404b and the foregoing repeats with the refined GDP 1404b used in place of the initial GDP 1404a. The refined GDP 1404b has multiple zones 108a, 108b, each having a different cross-sectional profile for respective holes 106a, 106b, and may be, for example, the multi-zone GDP 102 of FIG. 1. In some embodiments, the refinement continues for multiple iterations and/or until termination criteria are met. For example, the refinement may continue until CP map uniformity exceeds a predetermined value. Advantageously, iterative refinement allows the plasma-based etching and the CP map 1408 to achieve high uniformity.

To refine a GDP, values of the CP map 1408 localized to, or at the same location as, the GDP are grouped into two or more zones. The GDP may be, for example, the initial GDP 1404a or a previously refined GDP 1404b. In some embodiments, the number of zones increases with iterations of the foregoing process. For example, N+1 zones may be employed, where N is the number of times the foregoing process has been performed. Further, in some of such embodiments, zone boundaries are determined by dividing the difference between the minimum and maximum CP values of the zones by the number of zones. For example, supposing two zones and minimum and maximum CP values respectively of 2 and 6, the zone boundaries may be 2-4 and 4-6.

In other embodiments, the number of zones is three and boundaries of the zones are based on a normal or reference value range of the CP values. For example, CP values within the normal or reference value range may be grouped into a normal zone, CP values less than the normal or reference value range may be grouped into a low zone, and CP values greater than the normal or reference value range may be grouped into a high zone. The normal or reference value range may, for example, extend from an average or expected CP value minus a standard or target deviation to the average or expected CP value plus the standard or target deviation. The average CP value and the standard deviation may be, for example, statistically calculated across the zones or across the entire CP map 1408. The expected CP value may be determined by, for example, computer simulation, and/or the target deviation may be, for example, user specified.

With the zones determined, cross-sectional profiles of holes in the GDP are adjusted by zone, to compensate for non-uniformities of the CP values between zones, and the GDP is re-machined. As above, holes of a zone share a cross-sectional profile. In some embodiments, the cross-sectional profiles are adjusted based on the normal or reference value range and/or a relationship between the test parameter and a dimension, such as width, of the cross-sectional profiles. For example, if a CP value in a zone is outside the normal or reference value range, the dimension of the cross-sectional profile of the zone may be increased or decreased according to the relationship to move the CP value towards the normal or reference value range. The CP value may be, for example, an average, minimum, or maximum CP value of the zone. The relationship identifies whether increasing the dimension increases or decreases a respective CP value and may be, for example, empirically determined by trial and error. In some embodiments, increasing a width of a cross-sectional profile decreases respective CP values, and/or decreasing a width of a cross-sectional profile increases respective CP values.

While the method of FIG. 14 was illustrated and described with respect to MEMS motion sensors, it is to be appreciated that the method may be employed with other ICs employing plasma-based etching. For example, the method may be employed to generate a GDP that compensates for non-uniformities in a CP map of flash memory, image sensors, or other integrated circuits.

Figure 15:
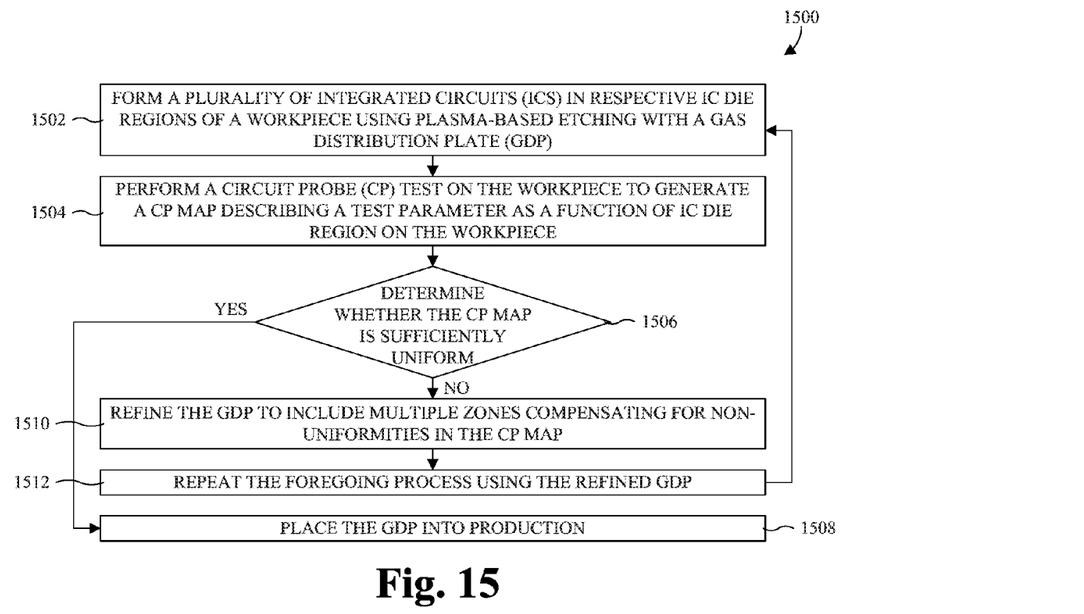
FIG. 15 illustrates a flowchart of the method of FIG. 14.

With reference to FIG. 15, a flowchart 1500 of some embodiments of the method of FIG. 14 is provided. At 1502, a plurality of ICs is formed distributed in respective IC die regions of a workpiece using plasma-based etching and a GDP. The ICs may, for example, include MEMS motion sensors. At 1504, a CP test is performed on the workpiece to generate a CP map describing a test parameter as a function of IC die region on the workpiece. At 1506, a determination is made as to whether the CP map is sufficiently uniform. If the CP map is sufficiently uniform, the GDP is placed into production at 1508. Otherwise, the GDP is refined at 1510 to include multiple zones compensating for non-uniformities in the CP map. At 1512, the foregoing process is repeated, starting at 1502, with the refined CP map.

Figure 16:
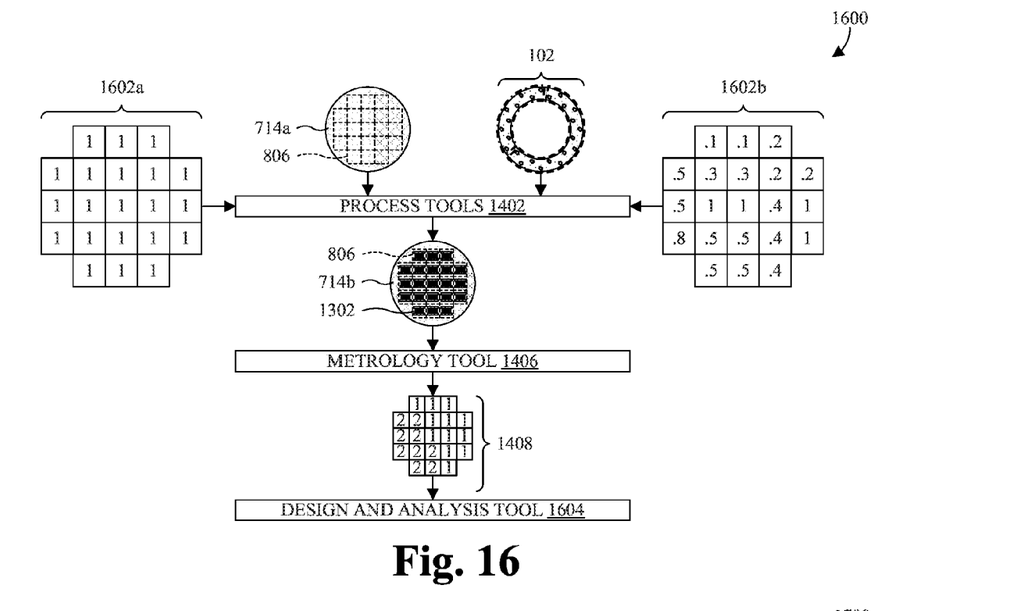
FIG. 16 illustrates a block diagram of a method for designing an exposure map.

With reference to FIG. 16, a block diagram 1600 illustrates some embodiments of a method for designing an exposure map. The method may, for example, continue from the method of FIGS. 14 and 15, and/or the exposure map may be, for example, used with the lithography process tool of FIG. 12. As illustrated, process tools 1402 perform a series of semiconductor manufacturing processes on an initial workpiece 714a such that a resulting workpiece 714b has a plurality of MEMS motion sensors 1302 distributed thereover in respective IC die regions 806.

The process tools 1402 include a lithography process tool, which may be, for example, as described in FIG. 12. While performing the series of semiconductor manufacturing processes, the lithography process tool repeatedly forms a photoresist mask in IC die regions of the initial workpiece 714a according to an initial exposure map 1602a. The photoresist mask has a layout of the MEMS motion sensors 1302 and may, for example, vary in size due, in part, to the initial exposure map 1602a. The initial exposure map 1602a describes exposure energy as a function of location and may, for example, have the same exposure energy for each location.

The process tools 1402 also include a plasma-based process tool, which may be, for example, as described in FIG. 7. While performing the series of semiconductor manufacturing processes, the plasma-based process tool performs plasma-based etching with a multi-zone GDP 102 and with the photoresist masks in place. The multi-zone GDP 102 may, for example, be designed as described in FIGS. 14 and 15, and/or may be, for example, as described in FIGS. 1, 2A, 2B, and 3-6.

After performing the series of semiconductor manufacturing processes, a metrology tool 1406 performs a CP test on the resulting workpiece 714b to test the MEMS motion sensors 1302 and to generate a CP map 1408. The CP map 1408 describes a test parameter of the MEMS motion sensors 1302 as a function of location on the resulting workpiece 714b. For example, the CP map 1408 may describe the test parameter as a function of IC die region on the resulting workpiece 714b. The test parameter varies with process variation and may, for example, be drive frequency, sense frequency, or critical dimension.

A design and analysis tool 1604 receives the CP map 1408 and determines whether to refine the initial exposure map 1602a. In some embodiments, the design and analysis tool 1604 bases the determination on yield or uniformity of the CP map 1408. If the design and analysis tool 1604 determines that refinement is inappropriate, the initial exposure map 1602a may be put into production and used to form the MEMS motion sensors 1302. Otherwise, the initial exposure map 1602a is refined into a refined exposure map 1602b and the foregoing repeats with the refined exposure map 1602b used in place of the initial exposure map 1602a. In some embodiments, the refinement continues for multiple iterations and/or until termination criteria are met. Advantageously, iterative refinement allows high CP map uniformity.

To refine an exposure map, exposure values of the exposure map are adjusted by location, such as IC die region, to compensate for non-uniformities in the CP map 1408. In some embodiments, the exposure values are adjusted based on a normal or reference value range of the CP values and/or a relationship between the test parameter and exposure energy. For example, if a CP value at a location is outside the normal or reference value range, the exposure value at the location is increased or decreased based on the relationship to move the CP value towards the normal or reference value range. The relationship identifies whether increasing the exposure energy increases or decreases a CP value and may be, for example, empirically determined by trial and error. In some embodiments, increasing exposure energy at a location increases a CP value at the location, and/or decreasing exposure energy at a location decreases a CP value at the location. The normal or reference value range may, for example, extend from an average or expected CP value (e.g., across the CP map 1408) minus a standard or target deviation to the average or expected CP value plus the standard or target deviation.

While the method of FIG. 16 was illustrated and described with respect to MEMS motion sensors, it is to be appreciated that the method may be employed with other integrated circuits employing plasma-based etching. For example, the method may be employed to generate an exposure map that compensates for non-uniformities in a CP map of flash memory, image sensors, or other integrated circuits.

Figure 17:
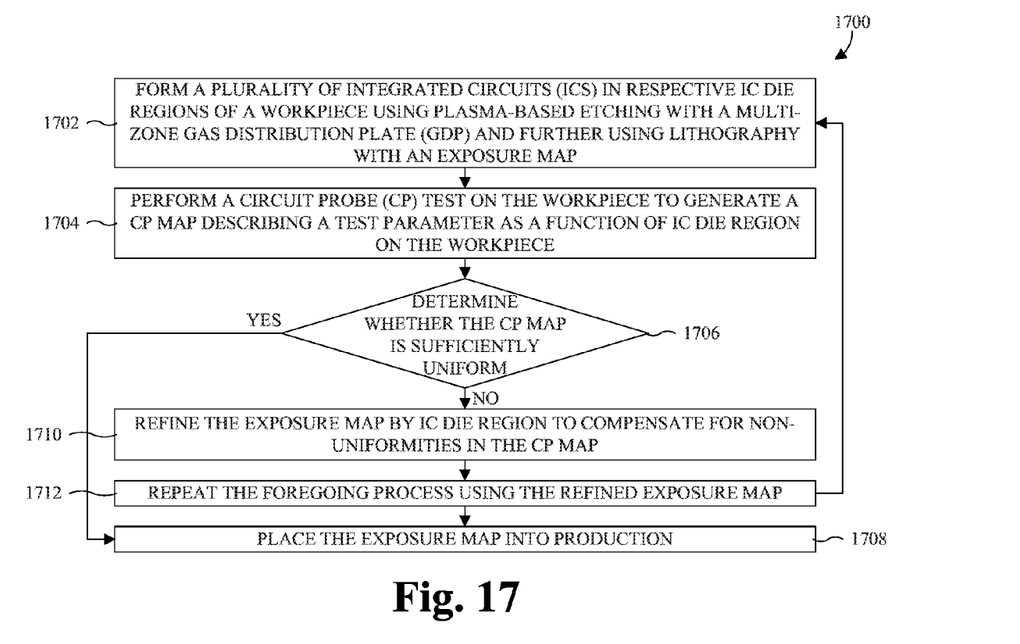
FIG. 17 illustrates a flowchart of the method of FIG. 16.

With reference to FIG. 17, a flowchart 1700 of some embodiments of the method of FIG. 16 is provided. At 1702, a plurality of ICs is formed in respective IC die regions of a workpiece using plasma-based etching with a multi-zone GDP and further using lithography with an exposure map. The ICs may, for example, include MEMS motion sensors. At 1704, a CP test is performed on the workpiece to generate a CP map describing a test parameter as a function of IC die region on the workpiece. At 1706, a determination is made as to whether the CP map is sufficiently uniform. If the CP map is sufficiently uniform, the exposure map is placed into production at 1708. Otherwise, the exposure map is refined by IC die region at 1710 to compensate for non-uniformities in the CP map. At 1712, the foregoing process is repeated, starting at 1702, with the refined exposure map.

While the methods described by the flowcharts 1500, 1700 of FIGS. 15 and 17 are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a plasma-based process tool. A housing defines a process chamber and comprises a gas inlet configured to receive a process gas. A GDP is arranged in the process chamber and is configured to distribute the process gas within the process chamber. The GDP comprises a plurality of holes extending through the GDP, and further comprises a plurality of zones into which the holes are grouped. The zones comprise a first zone and a second zone. Holes of the first zone share a first cross-sectional profile and holes of the second zone share a second cross-sectional profile different than the first cross-sectional profile.

In other embodiments, the present disclosure provides a method for designing a multi-zone GDP. A plurality of ICs is formed in respective IC die regions of a workpiece using plasma-based etching with a GDP. A CP test is performed on the workpiece to generate a CP map describing a test parameter as a function of IC die region. The GDP is refined based on the CP map to include multiple zones of holes compensating for non-uniformities in the CP map. Each zone of holes has a different cross-sectional profile shared by the holes of the zone.

In yet other embodiments, the present disclosure provides a process tool comprising a multi-zone GDP. The multi-zone GDP comprises a body with a plurality of holes. The holes extend through the body, from a lower surface of the body to an upper surface of the body. The multi-zone GDP further comprises a plurality of zones into which the holes are grouped. The zones are laterally arranged around a periphery of the body and comprise a first zone and a second zone. Holes of the first zone share a first cross-sectional profile and holes of the second zone share a second cross-sectional profile different than the first cross-sectional profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for designing a multi-zone gas distribution plate (GDP), the method comprising:
    forming a plurality of integrated circuits (ICs) in respective IC die regions of a workpiece using plasma-based etching with a GDP;
    performing a circuit probe (CP) test on the workpiece to generate a CP map describing a test parameter as a function of IC die region; and
    refining the GDP based on the CP map to include multiple zones of holes compensating for non-uniformities in the CP map, wherein each zone of the multiple zones has a different cross-sectional profile and a plurality of holes, and wherein each hole of a first one of the multiple zones individually has the different cross-sectional profile of the first one of the multiple zones.

2. The method according to claim 1, wherein refining the GDP comprises varying a width of a cross-sectional profile of a zone to move values of the CP map localized to the zone towards a reference value range of the CP map.

3. The method according to claim 1, further comprising:
    forming the plurality of ICs with individual microelectromechanical systems (MEMS) devices; and
    performing the CP test to generate the CP map describing drive frequency of the MEMS devices as a function of IC die region.

4. The method according to claim 3, wherein refining the GDP comprises:
    increasing a width of a cross-sectional profile of a zone in response to a value of the CP map localized to the zone being under a reference value range of the CP map; and
    decreasing the width of the cross-sectional profile in response to the value of the CP map being over the reference value range.

5. The method according to claim 1, wherein refining the GDP based on the CP map comprises increasing a width of the holes in one of the multiple zones vertically towards a lower surface of the GDP.

6. The method according to claim 1, wherein the test parameter is a physical parameter of semiconductor devices in the ICs, and wherein the physical parameter varies between the IC die regions.

7. The method according to claim 1, wherein refining the GDP based on the CP map comprises changing a width of a first region of one of the holes in one of the multiple zones, and wherein the first region is at a top of the GDP and is spaced over a bottom of the GDP.

8. The method according to claim 7, wherein refining the GDP based on the CP map comprises changing a width of a second region of the one of the holes, and wherein the second region is at a bottom of the GDP and underlies the first region.

9. The method according to claim 8, wherein the width of the second region is changed to a greater width than the width of the first region.

10. A method for performing a plasma-based process, the method comprising:
    forming a plurality of first integrated circuits (ICs) in respective IC die regions of a first workpiece using plasma-based etching with a gas distribution plate (GDP);
    measuring a test parameter at the first ICs to generate a first test map describing the test parameter as a function of location on the first workpiece;
    refining the GDP based on the first test map to include multiple zones of holes compensating for non-uniformities in the first test map, wherein each zone of the multiple zones has a plurality of holes and has a different cross-sectional profile, and wherein each hole of the multiple zones individually has the different cross-sectional profile of a corresponding one of the multiple zones;
    forming a plurality of second ICs in respective IC die regions of a second workpiece, wherein forming the second ICs comprises performing a plasma-based etch with the refined GDP, and wherein the plasma-based etch is performed selectively using photolithography and an exposure map;
    measuring the test parameter at the second ICs to generate a second test map describing the test parameter as a function of location on the second workpiece; and
    refining the exposure map based on the second test map to compensate for non-uniformities in the second test map.

11. The method according to claim 10, wherein the plasma-based etch comprises:
    forming a photoresist layer on the second workpiece;
    patterning the photoresist layer through selective exposure of the photoresist layer to radiation, wherein exposure energy of the selective exposure varies according to the exposure map;
    generating plasma in a process chamber, wherein the plasma is generated from a process gas distributed into the process chamber by the refined GDP; and
    applying the plasma to the second workpiece with the photoresist layer in place.

12. The method according to claim 10, further comprising forming a plurality of third ICs in respective IC die regions of a third workpiece using plasma-based etching, wherein forming the third ICs comprises performing a second plasma-based etch with the refined GDP, and wherein the second plasma-based etch is performed selectively using photolithography and the refined exposure map.

13. The method according to claim 10, wherein the GDP and the refined GDP each have a ring-shaped top layout.

14. A method comprising:
  forming integrated circuits (ICs) in respective IC die regions of a workpiece using a first gas distribution plate (GDP);
  measuring a test parameter of the ICs to generate a map describing the test parameter as a function of location on the workpiece;
  forming a refined GDP to compensate for non-uniformity in the map, wherein the refined GDP comprises a plurality of concentric ring-shaped paths and a plurality of holes arranged in a distribution pattern, wherein the plurality of holes are limited to the concentric ring-shaped paths, wherein the plurality of holes comprise first holes that define a first distribution zone and further comprise second holes that define a second distribution zone, wherein the first and second distribution zones respectively have a first cross-sectional hole profile and a second cross-sectional hole profile, and wherein the first and second cross-sectional hole profiles are different;
  arranging the refined GDP in a process chamber of a plasma-based process tool;
  introducing a process gas into the process chamber through the refined GDP, such that the process gas is distributed according to the distribution pattern; and
  generating plasma in the process chamber from the process gas.

15. The method according to claim 14, wherein forming the refined GDP comprises forming the plurality of holes with a width discretely increasing from top to bottom.

16. The method according to claim 14, wherein forming the refined GDP comprises forming the first and second holes, such that the first and second distribution zones are non-overlapping.

17. The method according to claim 16, wherein forming the refined GDP comprises forming the first and second holes, such that the first and second distribution zones are continuous.

18. The method according to claim 14, wherein each of the first holes individually has the first cross-sectional hole profile, and wherein each of the second holes individually has the second cross-sectional hole profile.

19. The method according to claim 18, wherein the plurality of holes comprise third holes that define a third distribution zone, wherein the third distribution zone has a third cross-sectional hole profile, wherein the third cross-sectional hole profile is different than the first and second cross-sectional hole profiles, and wherein forming the refined GDP comprises forming the plurality of holes, such that the first and second distribution zones are continuous and the third distribution zone is discontinuous.

20. The method according to claim 14, wherein forming the refined GDP comprises:
  forming a first hole of the first holes with a first region, wherein the first region of the first hole has a first width and extends vertically from an upper surface of the refined GDP to a transition region of the first hole;
  forming the first hole with a second region, wherein the second region of the first hole has a second width greater than the first width and extends vertically from the transition region of the first hole to a lower surface of the refined GDP;
  forming a second hole of the second holes with a first region, wherein the first region of the second hole has a third width and extends vertically from the upper surface of the refined GDP to a transition region of the second hole; and
  forming the second hole with a second region, wherein the second region of the second hole has a fourth width greater than the third width and extends vertically from the transition region of the second hole to the lower surface of the refined GDP.

* * * * *